US012444568B2

(12) United States Patent
Choi et al.

(10) Patent No.: US 12,444,568 B2
(45) Date of Patent: Oct. 14, 2025

(54) SAMPLE HOLDER OF TRANSMISSION ELECTRON MICROSCOPE AND SEMICONDUCTOR DEVICE INSPECTION METHOD USING THE SAMPLE HOLDER

(71) Applicant: Samsung Electronics Co., Ltd., Suwon-si (KR)

(72) Inventors: Yeoseon Choi, Suwon-si (KR); Donghoon Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 397 days.

(21) Appl. No.: 18/202,155

(22) Filed: May 25, 2023

(65) Prior Publication Data

US 2024/0105417 A1 Mar. 28, 2024

(30) Foreign Application Priority Data

Sep. 28, 2022 (KR) ........................ 10-2022-0123650

(51) Int. Cl.
*H01J 37/20* (2006.01)
*H01J 37/26* (2006.01)

(52) U.S. Cl.
CPC ............ *H01J 37/20* (2013.01); *H01J 37/261* (2013.01); *H01J 2237/2007* (2013.01)

(58) Field of Classification Search
CPC .. H01J 37/20; H01J 37/261; H01J 2237/2007; H01J 37/26; H01J 2237/201; H01J 37/28; H01L 22/10
See application file for complete search history.

(56) References Cited

U.S. PATENT DOCUMENTS

2015/0276567 A1* 10/2015 Schmidt .............. H01J 37/3053 250/442.11
2015/0294834 A1 10/2015 Routh, Jr. et al.
2019/0348253 A1* 11/2019 Konyuba .............. H01J 37/244
2020/0251303 A1 8/2020 Fuji et al.

FOREIGN PATENT DOCUMENTS

JP H04248237 A * 9/1992
JP 2000214056 A * 8/2000
JP 2002110078 A * 4/2002 .............. H01J 37/26
(Continued)

*Primary Examiner* — Michael J Logie
*Assistant Examiner* — Christopher J Gassen
(74) *Attorney, Agent, or Firm* — Muir Patent Law, PLLC

(57) ABSTRACT

A sample holder includes a head, a first holding plate extending in a first direction from one surface of the head and including at least one first sample hole configured to accommodate at least one first sample and a first main surface configured such that the at least one first sample accommodated in the at least one first sample hole is exposed at the first main surface, and a second holding plate extending in the first direction from the one surface of the head and including at least one second sample hole configured to accommodate at least one second sample and a second main surface configured such that the at least one second sample accommodated in the at least one second sample hole is exposed at the second main surface, wherein a direction perpendicular to the first main surface of the first holding plate differs from a direction perpendicular to the second main surface of the second holding plate.

20 Claims, 12 Drawing Sheets

(56) References Cited

FOREIGN PATENT DOCUMENTS

| | | | | | |
|---|---|---|---|---|---|
| JP | 3340603 | B2 | | 11/2002 | |
| JP | 4055066 | B2 | | 3/2008 | |
| JP | 2011204367 | A | * | 10/2011 | |
| JP | 2014062888 | A | * | 4/2014 | |
| JP | 2018-163878 | A | | 10/2018 | |
| JP | 2019-169334 | A | | 10/2019 | |
| KR | 10-0552590 | B1 | | 2/2006 | |
| KR | 10-1214985 | B1 | | 12/2012 | |
| KR | 101604055 | B1 | * | 3/2016 | .............. H01J 37/20 |
| KR | 10-2118266 | B1 | | 6/2020 | |

* cited by examiner

SAMPLE HOLDER OF TRANSMISSION ELECTRON MICROSCOPE AND SEMICONDUCTOR DEVICE INSPECTION METHOD USING THE SAMPLE HOLDER

CROSS-REFERENCE TO RELATED APPLICATION

This application is based on and claims priority under 35 U.S.C. § 119 to Korean Patent Application No. 10-2022-0123650, filed on Sep. 28, 2022, in the Korean Intellectual Property Office, the disclosure of which is incorporated by reference herein in its entirety.

BACKGROUND

The inventive concept relates to a sample holder of a transmission electron microscope (TEM), a semiconductor device inspection method using the sample holder, and a method of manufacturing a semiconductor device including the inspection method.

Generally, a process of manufacturing a semiconductor device is performed by continuously performing a plurality of unit processes. For example, wafers are manufactured into chips, which are semiconductor devices, by repeatedly performing processes such as photolithography processes, diffusion processes, etching processes, and deposition processes. Furthermore, analysis processes are performed between the unit processes, and whether the unit processes are normal is determined through the analysis processes. Structure analysis apparatuses for performing the analysis processes are equipment which observes the degree of crystallization and the structure of a crystal and include transmission electron microscopes.

Transmission electron microscopes are equipment which analyzes an image by allowing electrons accelerated to 200 KeV or more to pass through a sample manufactured to have a thickness of 100 nm or less, and in which a diffraction pattern may be formed through diffraction occurring on a crystal surface when electrons pass through a sample, and thus, this may be used to analyze a crystal structure.

SUMMARY

The inventive concept provides a sample holder of a transmission electron microscope and a semiconductor device inspection method using the sample holder, which may increase sample loading efficiency. The inventive concept also provides a method of manufacturing a semiconductor device including the semiconductor device inspection method.

According to an aspect of the inventive concept, there is provided a sample holder including a head, a first holding plate extending in a first direction from one surface of the head and including at least one first sample hole configured to accommodate at least one first sample and a first main surface configured such that the at least one first sample accommodated into the at least one first sample hole is exposed at the first main surface, and a second holding plate extending in the first direction from the one surface of the head and including at least one second sample hole configure to accommodate at least one second sample and a second main surface configured such that the at least one second sample accommodated into the at least one second sample hole is exposed at the second main surface, wherein a direction perpendicular to the first main surface of the first holding plate differs from a direction perpendicular to the second main surface of the second holding plate.

According to another aspect of the inventive concept, there is provided a sample holder including a head and a plurality of holding plates extending in a first direction from one surface of the head and each of the plurality of holding plates including at least one sample hole configured to accommodate at least one sample and a main surface configured such that the at least one sample accommodated into the at least one sample hole is exposed at the main surface, wherein directions perpendicular to respective main surfaces of at least two holding plates of the plurality of holding plates differ from each other, and at least one holding plate of the plurality of holding plates includes an internal space configured such that the at least one sample is disposed in the internal space and such that at least a portion of a lower surface and at least a portion of an upper surface of the at least one sample are exposed to outside of the at least one holding plate, a prop configured to support the lower surface of the at least one sample, and a fastener configured to plug an edge of the upper surface of the at least one sample.

According to another aspect of the inventive concept, there is provided a method of manufacturing a semiconductor device including fabricating samples by one or more semiconductor device manufacturing processes, placing the samples on a first holding plate and on a second holding plate of a sample holder, inspecting a first sample disposed on a first holding plate, rotating a head of the sample holder so that a top of a second sample disposed on the second holding plate is perpendicular to an incident light of an electron microscope, inspecting the second sample disposed on the second holding plate, modifying the one or more semiconductor device manufacturing processes based on the inspection result of the first sample and the second sample, and manufacturing a semiconductor device using the modified one or more semiconductor manufacturing processes, wherein the sample holder includes the head, the first holding plate extending in a first direction from one surface of the head and including at least one first sample hole accommodating the first sample and a first main surface at which the first sample placed in the at least one first sample hole is exposed, and the second holding plate extending in the first direction from the one surface of the head and including the second sample hole accommodating the second sample and a second main surface at which the second sample placed in the at least one second sample hole is exposed, and a direction perpendicular to the first main surface of the first holding plate differs from a direction perpendicular to the second main surface of the second holding plate.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1A:
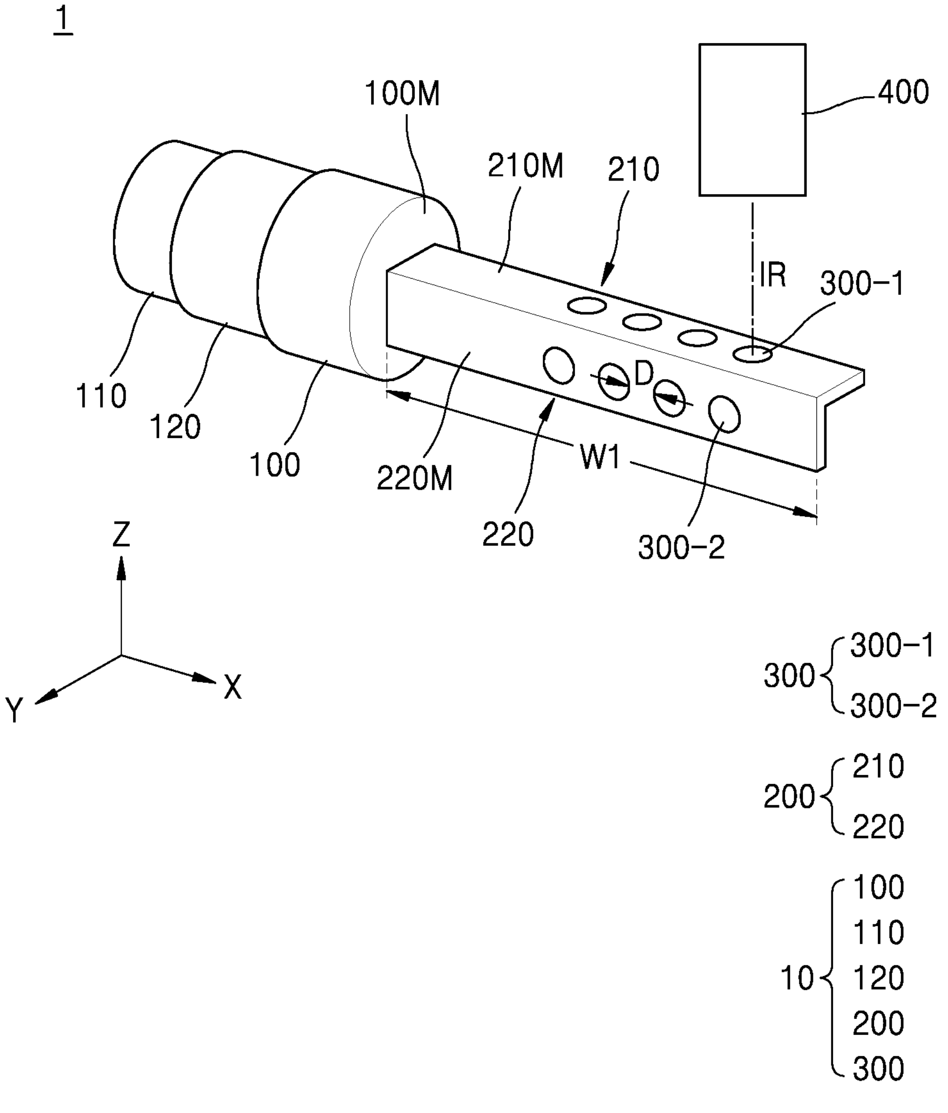
FIG. 1A is a perspective view of a sample holder including two holding plates and a semiconductor device inspection device including the sample holder, according to an embodiment.

Hereinafter, embodiments will be described in detail with reference to the accompanying drawings. Like reference numerals refer to like elements in the drawings, and their repeated descriptions are omitted.

Figure 1B:
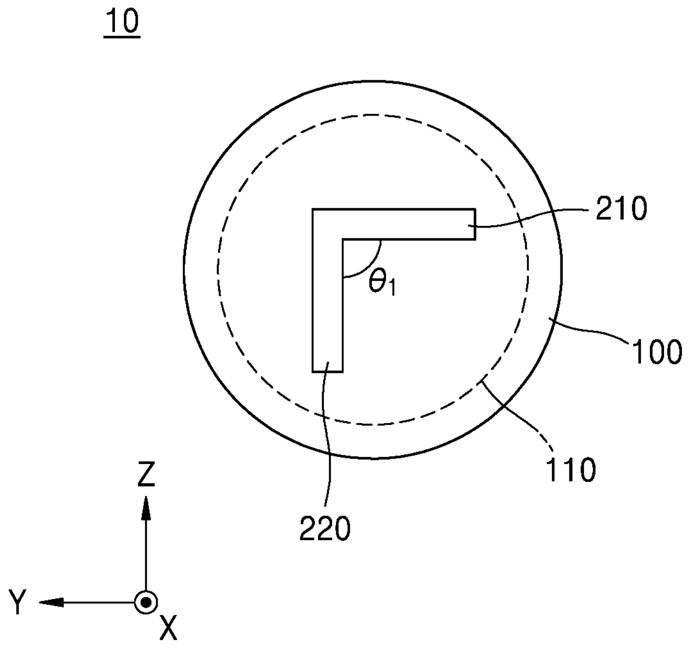
FIG. 1B is a side view of the sample holder including the two holding plates, according to an embodiment.
Figure 1C:
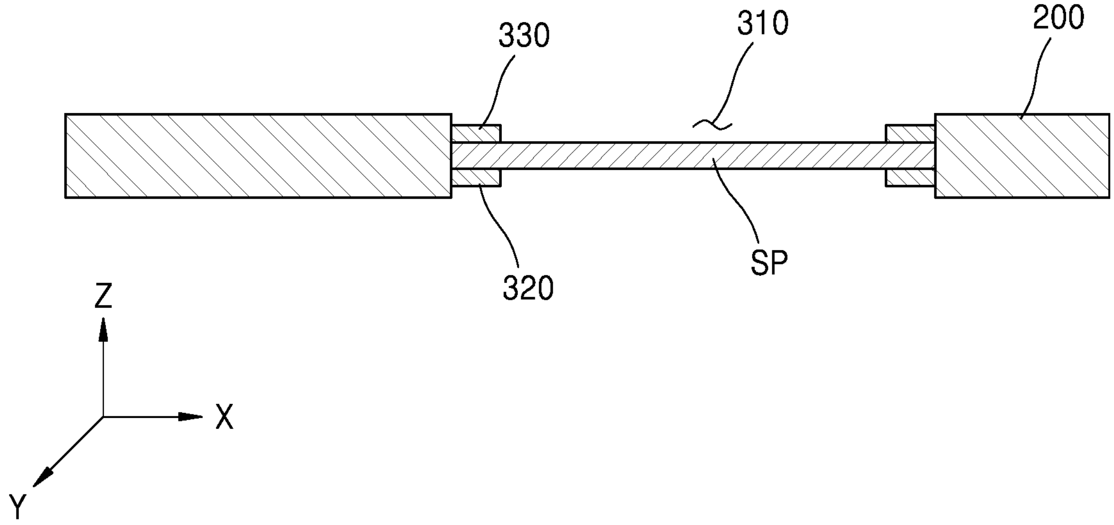
FIG. 1C is a cross-sectional view illustrating a configuration of a holding plate according to an embodiment.

FIG. 1A is a perspective view of a sample holder including two holding plates and a semiconductor device inspection apparatus including the sample holder, according to an embodiment, and FIG. 1B is a side view of the sample holder including the two holding plates, according to an embodiment. FIG. 1C is a cross-sectional view illustrating a configuration of a holding plate according to an embodiment. In FIG. 1C, for convenience of description, an example where the holding plate 200 includes one sample 300 is illustrated. For example, the holding plate 200 shown in FIG. 1C may be a portion of a holding plate 200.

Referring to FIGS. 1A to 1C, the semiconductor device inspection apparatus 1 may include a sample holder 10 and an electron microscope 400. The sample holder 10 may include a head unit 100, a handle 110, a rotary unit 120, a holding plate 200, and a sample hole 300 formed in the holding plate 200. The sample holder 10 may be a device which accommodates one or more samples SP so as to load the one or more samples SP into the electron microscope. The sample holder 10 may be configured so that the head unit 100 rotates, e.g., with respect to an axis passing through a center of the head unit 100, and thus, a plurality of sample holes 300 respectively disposed on/in a plurality of holding plates 200 (e.g., 210 and 220) are sequentially measured by the electron microscope 400. For example, the electron microscope 400 may include or may be a transmission electron microscope (TEM), a scanning electron microscope (SEM), and/or a scanning transmission electron microscope (STEM). For example, the sample holder 10 may be a sample holding device which an SEM may use a sample SP used in a TEM. For example, the sample holder 10 may be compatible with a SEM. For example, the sample holder 10 may be used in energy dispersive spectrometer (EDS) (not shown) analysis which measures a structure and a chemical composition of the sample SP by analyzing X-ray generated when an electron beam is radiated onto the sample SP through an EDS included in the electron microscope 400.

The head unit 100 may be disposed on one side of the holding plate 200 and may support the holding plate 200. In FIGS. 1A and 1B, the head unit 100 is illustrated in a cylindrical shape, but is not limited thereto. The head unit 100 may have various shapes and support the holding plate 200. For example, the head unit 100 may have a polygonal shape. Each of head units described in this disclosure may be a head or a head part, e.g., a head or head part of a sample holder (e.g., a portion near an end of the sample holder and/or having a relatively thick shape).

The rotary unit 120 may be disposed on the head unit 100, and the handle 110 may be disposed on the rotary unit 120. For example, the rotary unit 120 may be disposed on one side of the head unit 100, and the holding plate 200 may be disposed on the other side of the head unit 100. The handle 110 may enable the sample holder 10 to be easily gripped. The rotary unit 120 may rotate the head unit 100 and/or the holding plate 200. For example, the rotary unit 120 may include an actuator and may transfer a rotational force of the actuator to the head unit 100 and/or the holding plate 200. For example, the rotary unit 120 may have a diameter which is less than that of the head unit 100. For example, both of the rotary unit 120 and the head unit 100 may have cylindrical shape and the dimeter of the cylindrical shape of the head unit 100 may be greater than the diameter of the cylindrical shape of the rotary unit 120. For example, an area (e.g., a boundary surface) where the rotary unit 120 contacts the head unit 100 may be greater in size than an area (e.g., a boundary surface) where the holding plate 200 contacts the head unit 100. For example, the area where the rotary unit 120 contacts the head unit 100 may be greater in size than an area defined by an area of the holding plate 200 contacting the head unit 100. For example, the rotary unit 120 may rotate the holding plate 200 with respect to a rotational axis extending in a first horizontal direction (an X direction). For example, the rotary unit 120 may rotate the holding plate 200 with respect to a rotational axis which extends in a direction perpendicular to an incident direction of incident light IR of the electron microscope 400. In another embodiment, the head unit 100 may not include the handle 110 and/or the rotary unit 120. Each of rotary units 120 described in this disclosure may be a rotary, e.g., a rotary 120 configured to rotate a sample holding plate 200 or a plurality of sample holding plates of a sample holder, e.g., by rotating the head 100.

The sample holder 10 may include a plurality of holding plates 200 (e.g., 210 and 220). For example, the sample holder 10 may include a first holding plate 210 and a second holding plate 220. The first holding plate 210 and the second holding plate 220 may be arranged to extend in the first horizontal direction (the X direction) onto one surface of the head unit 100. The first holding plate 210 and the second holding plate 220 may be disposed on the head unit 100 to form an angle, which is not 180 degrees, therebetween. For example, a direction perpendicular to a main surface 210M of the first holding plate 210 may differ from a direction perpendicular to a main surface 220M of the second holding plate 220. Each of the main surface 210M of the first holding plate 210 and the main surface 220M of the second holding plate 220 may be on a plane. For example, both of the main surfaces 210M and 220M are flat and the planes on which the respective main surfaces 210M and 220M disposed to cross each other. The main surface 210M of the first holding plate 210 may denote a surface at which a sample hole 300 disposed/formed in the first holding plate 210 is exposed. Also, the main surface 220M of the second holding plate 220 may denote a surface at which a sample hole 300 disposed/formed in the second holding plate 220 is exposed. The main surfaces of holding plates in the present disclosure may be surfaces of the holding plates facing an electron beam (e.g., an incident light IR) emitter of the electron microscope 400. For example, the main surfaces may be surfaces of the holding plates on which the incident light IR is incident. For example, the incident light IR of the electron microscope 400 may be an electron beam.

For example, the sample hole 300 formed/disposed in the first holding plate 210 may be referred to as a first sample hole 300-1, and the sample hole 300 formed/disposed in the second holding plate 220 may be referred to as a second sample hole 300-2. A sample SP disposed in the first sample hole 300-1 may be referred to as a first sample, and a sample SP disposed in the second sample hole 300-2 may be referred to as a second sample.

For example, a first width W1 which is a width of the first holding plate 210 in a first horizontal direction (an X direction) and/or a width of the second holding plate 220 in the first horizontal direction (the X direction) may be about 15 cm to about 35 cm. For example, the width of the first holding plate 210 in the first horizontal direction (the X direction) may be the same as the width of the second holding plate 220 in the first horizontal direction (the X direction). In another embodiment, the width of the first holding plate 210 in the first horizontal direction (the X direction) may differ from the width of the second holding plate 220 in the first horizontal direction (the X direction).

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Herein, a direction perpendicular to the main surface 100M of the head unit 100 may be defined as the first horizontal direction (the X direction), and a direction of the incident light IR of the electron microscope 400 may be defined as a vertical direction (a Z direction). A direction perpendicular to both of the first horizontal direction (the X direction) and the vertical direction (the Z direction) may be defined as a second horizontal direction (a Y direction).

For example, the first holding plate 210 and the second holding plate 220 may be provided as one body, e.g., be integrally formed. In another embodiment, each of the first holding plate 210 and the second holding plate 220 may be individually provided, e.g., as two separate bodies. At least a portion of the first holding plate 210 may contact the second holding plate 220. The first holding plate 210 and the second holding plate 220 may form a first angle ($\theta_1$) therebetween. A range of the first angle ($\theta_1$) may be about 90 degrees to about 180 degrees. For example, the first angle ($\theta_1$) may be between about 90 degrees and about 180 degrees. When the first angle (01) is less than about 90 degrees, in a case where the first sample hole 300-1 of the first holding plate 210 or a sample disposed on it is scanned by the electron microscope 400, the incident light IR of the electron microscope 400 passing through the first sample hole 300-1 may be incident on the second holding plate 220. On the other hand, in a case where the second sample hole 300-2 of the second holding plate 220 or a sample disposed on it is scanned by the electron microscope 400, the incident light IR of the electron microscope 400 passing through the second sample hole 300-2 may be incident on the first holding plate 210. Therefore, the first angle ($\theta_1$) is greater than or equal to about 90 degrees. When the first angle ($\theta_1$) is about 180 degrees, both of the first holding plate 210 and the second holding plate 220 will be on the same plane. Therefore, the first angle ($\theta_1$) may be less than about 180 degrees. For example, when the first angle ($\theta_1$) is about 180 degrees, the first holding plate 210 and the second holding plate 220 may be considered as one plate (e.g., the first holding plate 210).

Each of the first holding plate 210 and the second holding plate 220 may include a plurality of sample holes 300. Each of the first holding plate 210 and the second holding plate 220 illustrated in FIGS. 1A and 1B includes four sample holes 300, but the number of sample holes 300 included in each of the first holding plate 210 and the second holding plate 220 is not limited thereto. For example, the first holding plate 210 and/or the second holding plate 220 may include three or less sample holes 300, or may include five or more sample holes 300. For example, in a plurality of sample holes 300 provided in the same holding plate 200, a separation distance D between a plurality of sample holes 300 adjacent (e.g., directly adjacent or nearest) to each other in the first horizontal direction (the X direction) may be about 3 mm to about 10 mm. For example, in a plurality of sample holes 300 provided in the same holding plate 200, the plurality of sample holes 300 may be arranged apart from one another by a certain interval. For example, a plurality of sample holes 300 may be arranged in a lattice or grid shape. In another embodiment, a plurality of sample holes 300 may have different separation distances in the holding plate 200. Separation distances in the present disclosure are distances between corresponding pair of elements/components.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. Other words used to describe the relationship between elements should be interpreted in a like fashion (e.g., "between" versus "directly between," "adjacent" versus "directly adjacent," etc.).

The holding plate 200 may include an internal space 310 where the sample SP is disposed, a prop 320, and a fixing member 330, in the sample hole 300. The sample hole 300 may provide a path through which the incident light IR of the electron microscope 400 passing through the sample SP passes in a vertical downward direction. For example, the sample SP may have a circular thin film shape, and the internal space 310 may have a circular shape. The internal space 310 may have a shape where at least a portion of a lower surface of the sample SP and at least a portion of an upper surface of the sample SP are open. The internal space 310 may be formed to pass through a portion of the holding plate 200 in a direction perpendicular to the main surface of the holding plate 200. For example, the internal space 310 may be formed to pass through a portion of the holding plate 200 in the second horizontal direction (the Y direction) and/or the vertical direction (the Z direction) The prop 320 and/or the fixing member 330 may be formed to protrude from an inner surface of the internal space 310 to an inner portion of the internal space 310. The prop 320 and the fixing member 330 may be disposed at different vertical levels. The prop 320 may support at least a portion of the lower surface of the sample SP. For example, the prop 320 may plug/support an edge of the lower surface of the sample SP. The fixing member 330 may plug/press an edge of the upper surface of the sample SP. For example, a size of an internal space formed by each of the prop 320 and the fixing member 330 may be less than a horizontal area of the sample SP. For example, the prop 320 and/or the fixing member 330 may have a ring shape. In another embodiment, each of the prop 320 and/or the fixing member 330 may be formed based on a plurality of protrusion portions arranged at the same vertical level. The fixing member 330 described above and/or below may be a fastener configured to fasten a sample SP on the prop 320. For example, the fastener 330 may fasten the sample SP when the sample SP is disposed on the prop 330.

Spatially relative terms, such as "downward," "upward," "vertical," "horizontal," "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Herein, one of two surfaces, which is disposed at a relatively higher level than the other, of an arbitrary element apart from each other in the vertical direction (the Z direction) may be defined as an upper surface, and the other of the two surfaces of the arbitrary element may be defined as a lower surface.

In FIG. 1C, an example is illustrated where a sample SP disposed on the prop 320 is fixed by the fixing member 330 disposed on the sample SP by using a press scheme, but a scheme of fixing the sample SP by using the fixing member 330 is not limited thereto. For example, the fixing member 330 may include a spring.

The electron microscope 400 may radiate/emit the incident light IR onto the sample SP disposed in the sample hole 300 in a direction vertical and/or perpendicular to the sample hole 300. At least a portion of the incident light IR radiated/emitted onto the sample SP may pass through the sample SP and may be input to and received by the electron microscope 400, and the electron microscope 400 may measure and/or analyze light input thereto. In another embodiment, at least a portion of the incident light IR radiated onto the sample SP may pass through the sample SP, and then, light reflected by a reflection plate (not shown) disposed at a vertical level which is lower than the sample hole 300 may be measured and/or analyzed by the electron microscope 400. For example, the electron microscope 400 may include a reflection plate positioned under the positon at which the sample holder 10 is placed.

A general sample holder may include one holding plate, and the sample loading efficiency of a sample holder of an electron microscope may be relatively low. Also, in the general sample holder, one holding plate may include one sample hole, and the sample loading efficiency of the sample holder of the electron microscope may be relatively low.

On the other hand, the sample holder 10 according to an embodiment may include a plurality of holding plates 200 (e.g., 210 and 220) into which one or more samples SP are loaded and may continuously perform an operation on a plurality of samples SP, and thus, sample loading efficiency may be relatively high. Also, in the sample holder 10 according to an embodiment, one holding plate 200 (210 or 220) may include a plurality of sample holes 300 (e.g., 300-1 and 300-2) and an operation may be continuously performed on a plurality of samples SP respectively loaded in the sample holes 300, and thus, sample loading efficiency may be relatively high. For example, the sample holder 10 of the embodiments having multiple sample holes 300 and/or multiple sample holding plates 200 (e.g., 210 and 220) may enhance inspection efficiency of the semiconductor device inspection apparatus 1.

Figure 2A:
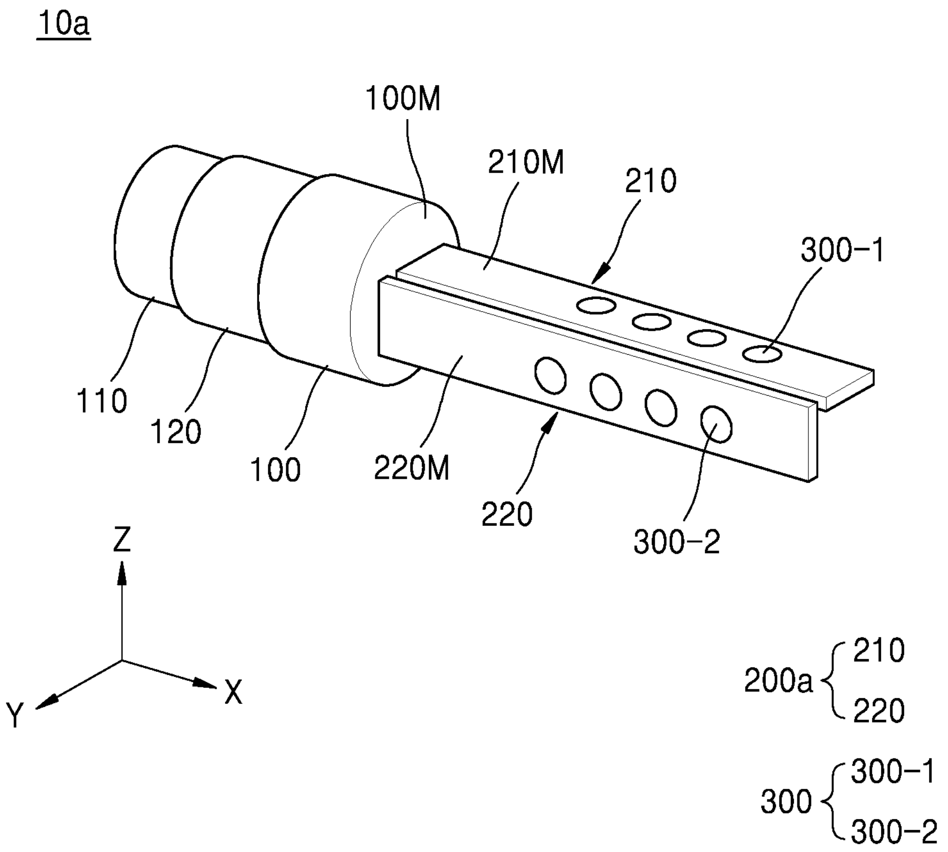
FIG. 2A is a perspective view of a sample holder including two holding plates, according to an embodiment.
Figure 2B:
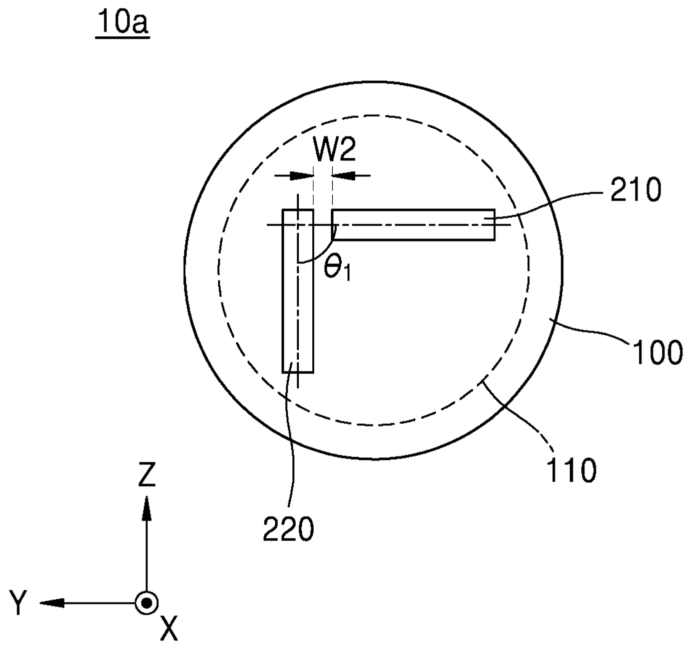
FIG. 2B is a side view of the sample holder including the two holding plates, according to an embodiment.

FIG. 2A is a perspective view of a sample holder including two holding plates, according to an embodiment, and FIG. 2B is a side view of the sample holder including the two holding plates, according to an embodiment.

Referring to FIGS. 2A and 2B, the sample holder 10*a* may include a head unit 100, a holding plate 200*a* (210 or 220), and a sample hole 300. The head unit 100 and the sample hole 300 of FIGS. 2A and 2B may be substantially the same or the same as the head unit 100 and the sample hole 300 of FIGS. 1A to 1C respectively, and thus, only the holding plate 200*a* will be described below.

The sample holder 10*a* may include a plurality of holding plates 200*a* (e.g., 210 and 220). For example, the sample holder 10*a* may include a first holding plate 210 and a second holding plate 220. The first holding plate 210 and the second holding plate 220 may be arranged to extend in the first horizontal direction (the X direction) from one surface of the head unit 100. The first holding plate 210 and the second holding plate 220 may be disposed on (e.g., contact) the head unit 100 to form an angle, which is not 180 degrees, therebetween. For example, a direction perpendicular to a main surface 210M of the first holding plate 210 may differ from a direction perpendicular to a main surface 220M of the second holding plate 220.

For example, each of the first holding plate 210 and the second holding plate 220 may be individually provided. For example, the first holding plate 210 and the second holding plate 220 may be separated from each other. The first holding plate 210 and the second holding plate 220 may be arranged apart from each other in a second horizontal direction (a Y direction) and/or a vertical direction (a Z direction). For example, the first holding plate 210 and the second holding plate 220 may be arranged apart from each other in a direction perpendicular to a direction in which one of the first holding plate 210 and the second holding plate 220 extends, e.g., perpendicular to a lengthwise direction of the holding plates 210 and 220. For example, the first holding plate 210 and the second holding plate 220 may be apart from each other in the second horizontal direction (the Y direction) and/or the vertical direction (the Z direction) to have a second horizontal width W2. A range of the second horizontal width W2 may be about 1 mm to about 5 cm. For example, the second horizontal width W2 may be between about 1 mm and about 5 cm.

The first holding plate 210 and the second holding plate 220 may form a first angle ($\theta_1$) therebetween. A range of the first angle ($\theta_1$) may be about 90 degrees to about 180 degrees. For example, the first angle ($\theta_1$) may be between about 90 degrees and about 180 degrees. When the first angle ($\theta_1$) is less than about 90 degrees, in a case where the first sample hole 300-1 of the first holding plate 210 is scanned by the electron microscope 400, the incident light IR of the electron microscope 400 passing through the first sample hole 300-1 and/or passing through a sample SP disposed in the first sample hole 300-1 may be incident on the second holding plate 220. Similarly, in a case where the second sample hole 300-2 of the second holding plate 220 is scanned by the electron microscope 400, the incident light IR of the electron microscope 400 passing through the second sample hole 300-2 and/or passing through a sample SP disposed in the second sample hole 300-2 may be incident on the first holding plate 210. Therefore, the first angle ($\theta_1$) is greater than or equal to about 90 degrees. When the first angle ($\theta_1$) is about 180 degrees, both of the first holding plate 210 and the second holding plate 220 may be on the same a plane, which may have the same effect as one wide holding plate. Therefore, the first angle ($\theta_1$) may be less than about 180 degrees.

Figure 3A:
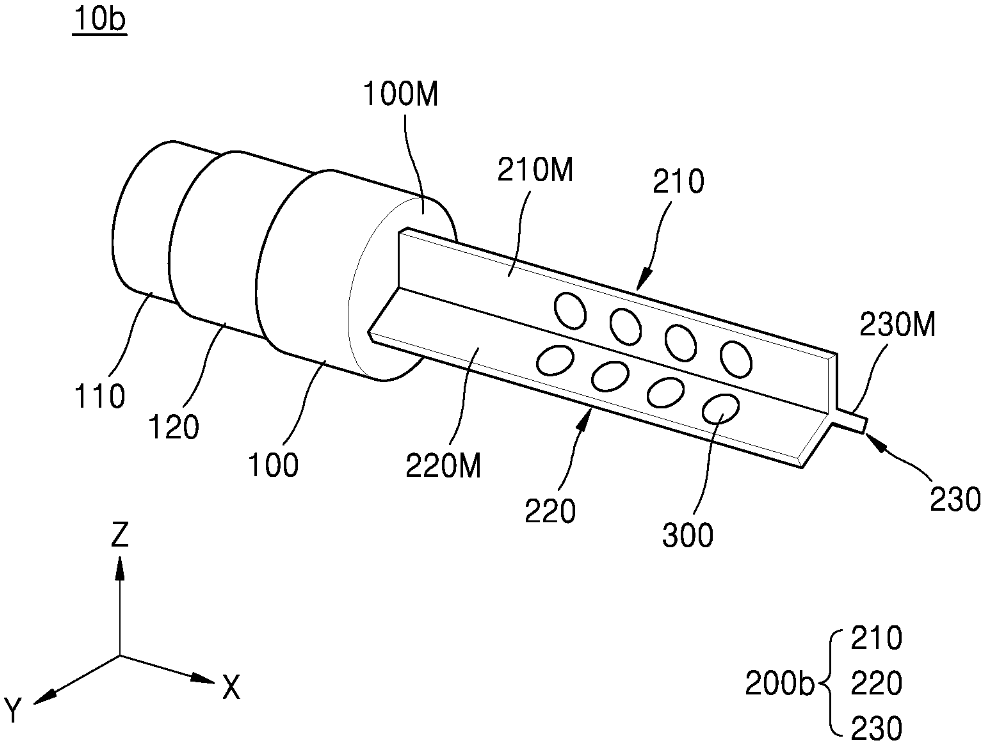
FIG. 3A is a perspective view of a sample holder including three holding plates, according to an embodiment.
Figure 3B:
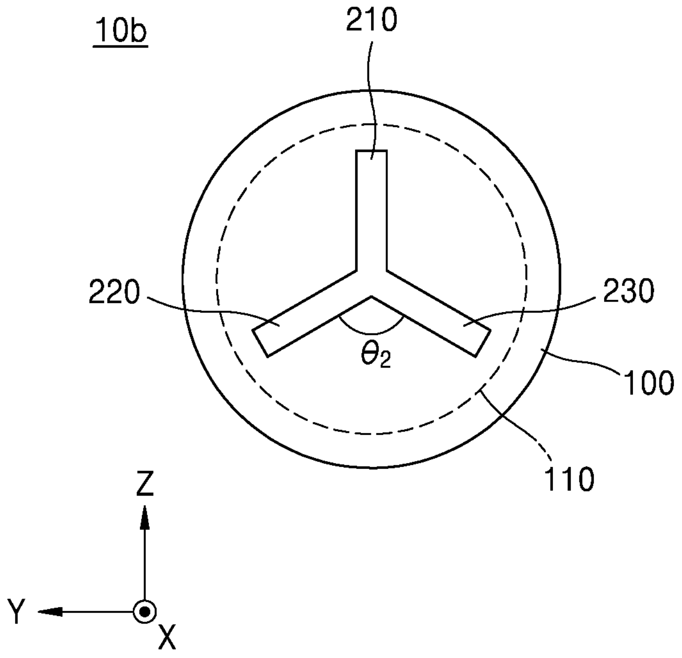
FIG. 3B is a side view of the sample holder including the three holding plates, according to an embodiment.

FIG. 3A is a perspective view of a sample holder including three holding plates, according to an embodiment, and FIG. 3B is a side view of the sample holder including the three holding plates, according to an embodiment.

Referring to FIGS. 3A and 3B, the sample holder 10*b* may include a head unit 100, a holding plate 200*b*, and a sample hole 300. The head unit 100 and the sample hole 300 of FIGS. 3A and 3B may be substantially the same or the same as the head unit 100 and the sample hole 300 of FIGS. 1A to 1C respectively, and thus, only the holding plate 200*b* will be described below.

For example, the sample holder 10*b* may include a first holding plate 210, a second holding plate 220, and a third holding plate 230. The first holding plate 210, the second holding plate 220, and the third holding plate 230 may be arranged to extend in a first horizontal direction (an X direction) from one surface of the head unit 100. The first holding plate 210, the second holding plate 220, and the third holding plate 230 may be arranged on (e.g., contact) the head unit 100 to form an angle therebetween other than about 180 degrees. In another embodiment, at least two holding plates 200*b* of the first holding plate 210, the second holding plate 220, and the third holding plate 230 may form an angle of about 180 degrees therebetween. For example, a direction perpendicular to a main surface 210M of the first holding plate 210, a direction perpendicular to a main surface 220M of the second holding plate 220, and a direction perpendicular to a main surface 230M of the third holding plate 230 may differ from each other. In certain embodiments, at least two directions of the direction perpendicular to the main surface 210M of the first holding plate 210, the direction perpendicular to the main surface 220M of the second holding plate 220, and the direction perpendicular to the main surface 230M of the third holding plate 230 may differ from each other. For example, a width of the first holding plate 210 in the first horizontal direction (the X direction), a width of the second holding plate 220 in the first horizontal direction (the X direction), and a width of the third holding plate 230 in the first horizontal direction (the X direction) may be equal to one another or be the same. In another embodiment, at least two widths of the width of the first holding plate 210 in the first horizontal direction (the X direction), the width of the second holding plate 220 in the first horizontal direction (the X direction), and the width of the third holding plate 230 in the first horizontal direction (the X direction) may differ from each other.

For example, the first holding plate 210, the second holding plate 220, and the third holding plate 230 may be provided as one body. For example, the first, second and third holding plates 210, 220 and 230 may be integrally formed. For example, each of the first holding plate 210, the second holding plate 220, and the third holding plate 230 may contact one or more other holding plates among the first holding plate 210, the second holding plate 220, and the third holding plate 230. In another embodiment, at least two holding plates 200*b* of the first holding plate 210, the second holding plate 220, and the third holding plate 230 may be provided as separate elements from each other. For example, at least two holding plates 200*b* of the first holding plate 210, the second holding plate 220, and the third holding plate 230 may be arranged apart from each other in a second horizontal direction (a Y direction) and/or a vertical direction (a Z direction).

For example, two adjacent holding plates 200*b* of a plurality of holding plates 200*b* may form a second angle ($\theta_2$) therebetween, and a range of the second angle ($\theta_2$) may be about 90 degrees to about 180 degrees. For example, the second angle ($\theta_2$) may be between about 90 degrees and about 180 degrees. The second angle ($\theta_2$) is greater than or equal to about 90 degrees. When the second angle ($\theta_2$) is less than about 90 degrees, the holding plate 210*b* may interfere in light incident on the sample hole 300. For example, the second angle ($\theta_2$) may be about 120 degrees. Also, the second angle ($\theta_2$) is less than or equal to about 180 degrees.

At least one of the first holding plate 210, the second holding plate 220, and the third holding plate 230 may include a plurality of sample holes 300. Each of the first holding plate 210, the second holding plate 220, and the third holding plate 230 illustrated in FIGS. 3A and 3B includes four sample holes 300, but the number of sample holes 300 included in each of the first holding plate 210, the second holding plate 220, and the third holding plate 230 is not limited thereto. For example, each (or one or more) of the first holding plate 210, the second holding plate 220, and/or the third holding plate 230 may include three or less sample holes 300, or may include five or more sample holes 300. For example, in a holding plate 200*b*, each of a plurality of sample holes 300 may be disposed apart from a sample hole 300 adjacent thereto in the first horizontal direction (the X direction) by a separation distance of about 3 mm to about 10 mm. For example, in each of the holding plates 210, 220 and 230, each sample hole 300 may be spaced apart from its directly adjacent (e.g., nearest) sample hole(s) 300 in the first horizontal direction (the X direction) by a distance of about 3 mm to about 10 mm. For example, a plurality of sample holes 300 may be arranged apart from one another by a certain interval. For example, a plurality of sample holes 300 may be arranged in a lattice or grid shape. In another embodiment, a plurality of sample holes 300 may have different separation distances in the holding plate 210*b*.

Figure 4A:
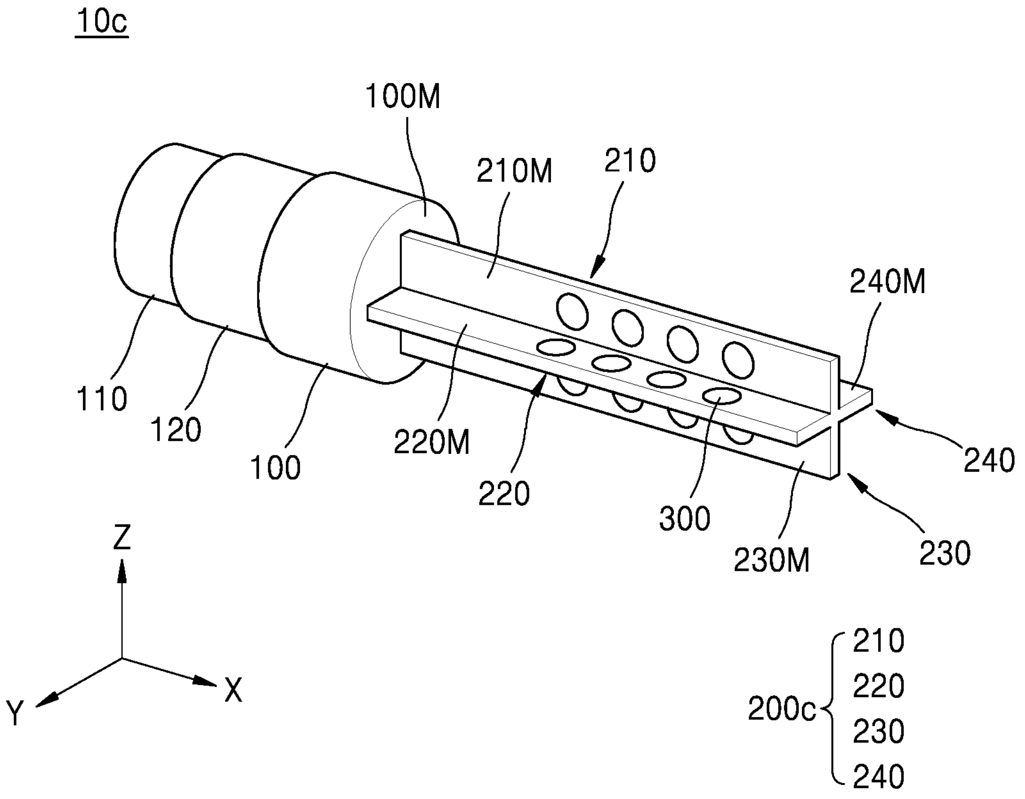
FIG. 4A is a perspective view of a sample holder including four holding plates, according to an embodiment.
Figure 4B:
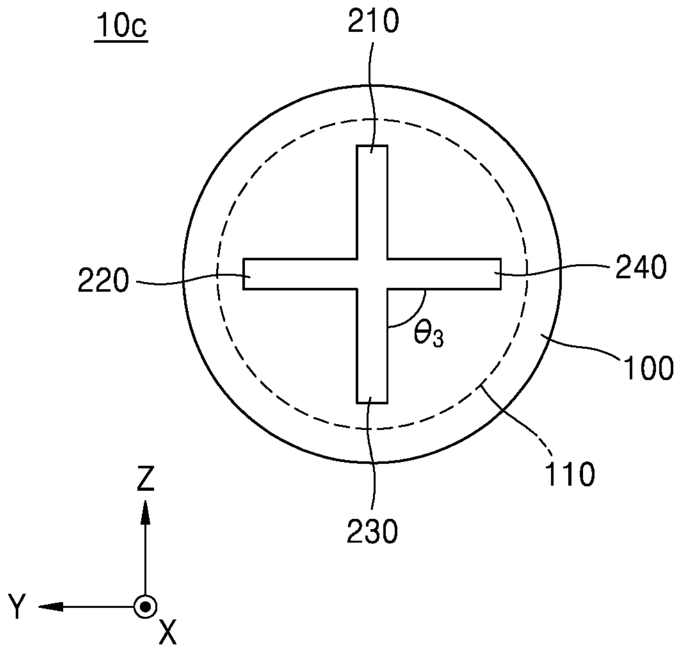
FIG. 4B is a side view of the sample holder including the four holding plates, according to an embodiment.

FIG. 4A is a perspective view of a sample holder including four holding plates, according to an embodiment, and FIG. 4B is a side view of the sample holder including the four holding plates, according to an embodiment.

Referring to FIGS. 4A and 4B, the sample holder 10*c* may include a head unit 100, a holding plate 200*c*, and a sample hole 300. The head unit 100 and the sample hole 300 of FIGS. 4A and 4B may be the same or substantially the same as the head unit 100 and the sample hole 300 of FIGS. 1A to 1C respectively, and thus, only the holding plate 200*c* will be described below.

The sample holder 10*c* may include a plurality of holding plates 200*c*. For example, the sample holder 10*c* may include a first holding plate 210, a second holding plate 220, a third holding plate 230, and a fourth holding plate 240. The first holding plate 210, the second holding plate 220, the third holding plate 230, and the fourth holding plate 240 may be arranged to extend in a first horizontal direction (an X direction) from the head unit 100.

For example, the first holding plate 210, the second holding plate 220, the third holding plate 230, and the fourth holding plate 240 may be provided as one body. For example, the first, second, third and fourth holding plates 210, 220, 230 and 240 may be integrally formed. For example, a portion of each of the first holding plate 210, the second holding plate 220, the third holding plate 230, and the fourth holding plate 240 may contact one or more other holding plates among the first holding plate 210, the second holding plate 220, the third holding plate 230, and the fourth holding plate 240. In another embodiment, at least two holding plates 200*c* of the first holding plate 210, the second holding plate 220, the third holding plate 230, and the fourth holding plate 240 may be provided as separate elements from each other. For example, at least two holding plates 200*c* of the first holding plate 210, the second holding plate 220, the third holding plate 230, and the fourth holding plate 240 may be arranged apart from each other in a second horizontal direction (a Y direction) and/or a vertical direction (a Z direction). For example, a width of the first holding plate 210 in the first horizontal direction (the X direction), a width of the second holding plate 220 in the first horizontal direction (the X direction), a width of the third holding plate 230 in the first horizontal direction (the X direction), and a width of the fourth holding plate 240 in the first horizontal direction (the X direction) may be equal to one another or be the same. In another embodiment, at least two widths among/of the width of the first holding plate 210 in the first horizontal direction (the X direction), the width of the second holding plate 220 in the first horizontal direction (the X direction), the width of the third holding plate 230 in the first horizontal direction (the X direction), and the width of the fourth holding plate 240 in the first horizontal direction (the X direction) may differ from each other. For example, in the present disclosure, the widths of the holding plates in the first horizontal direction (the X direction) may be lengthwise distances of the holding plates, and may be called as lengths of the holding plates in the first horizontal direction in certain examples.

Two holding plates 200*c*, which are adjacent to each other along a main surface 100M of the head unit 100, of the plurality of holding plates 210*c* may form a third angle ($\theta_3$) therebetween. For example, two holding plates 200*c*, which are adjacent to each other along a circumference of the head unit 100, among the plurality of holding plates 210*c* may form the third angle ($\theta_3$) therebetween. A range of the third angle ($\theta_3$) may be about 90 degrees to about 180 degrees. For example, the third angle ($\theta_3$) may be between about 90 degrees and about 180 degrees. The third angle ($\theta_3$) is greater than or equal to about 90 degrees. When the third angle ($\theta_3$) is less than about 90 degrees, the holding plate 210*c* may interfere in light incident on the sample hole 300. For example, the third angle ($\theta_3$) may be about 90 degrees. For example, a direction perpendicular to a main surface 210M of the first holding plate 210 may be equal to a direction perpendicular to a main surface 230M of the third holding plate 230, and a direction perpendicular to a main surface 220M of the second holding plate 220 may be equal to a direction perpendicular to a main surface 240M of the fourth holding plate 240.

At least one of the first holding plate 210, the second holding plate 220, the third holding plate 230, and the fourth holding plate 240 may include a plurality of sample holes 300. Each of the first holding plate 210, the second holding plate 220, the third holding plate 230, and the fourth holding plate 240 illustrated in FIGS. 4A and 4B includes four sample holes 300, but the number of sample holes 300 included in each of the first holding plate 210, the second holding plate 220, the third holding plate 230, and the fourth holding plate 240 is not limited thereto. For example, each (or one or more) of the first holding plate 210, the second holding plate 220, the third holding plate 230, and the fourth holding plate 240 may include three or less sample holes 300, or may include five or more sample holes 300. For example, in the same holding plate 210*d*, each of a plurality of sample holes 300 may be disposed apart from a sample hole 300 adjacent (e.g., directly adjacent or nearest) thereto in the first horizontal direction (the X direction) by a separation distance of about 3 mm to about 10 mm. For example, a plurality of sample holes 300 may be arranged apart from one another by a certain interval. For example, a plurality of sample holes 300 may be arranged in a lattice or grid shape. In another embodiment, a plurality of sample holes 300 may have different separation distances in the holding plate 210*c*.

Hereinabove, in FIGS. 1A to 4B, the sample holders 10, 10*a*, 10*b*, and 10*c* respectively including the holding plates 200, 200*a*, 200*b*, and 200*c* are illustrated, but the inventive concept is not limited thereto and the sample holder 10 may include four or more holding plates 200.

Figure 5A:
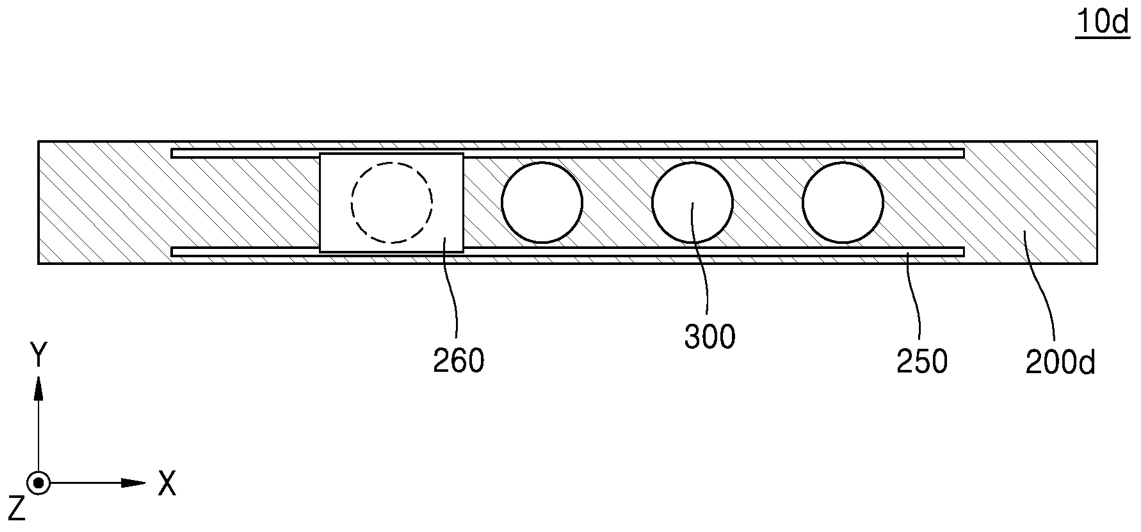
FIG. 5A is a plan view of a holding plate including a rail and a cover, according to an embodiment.
Figure 5B:
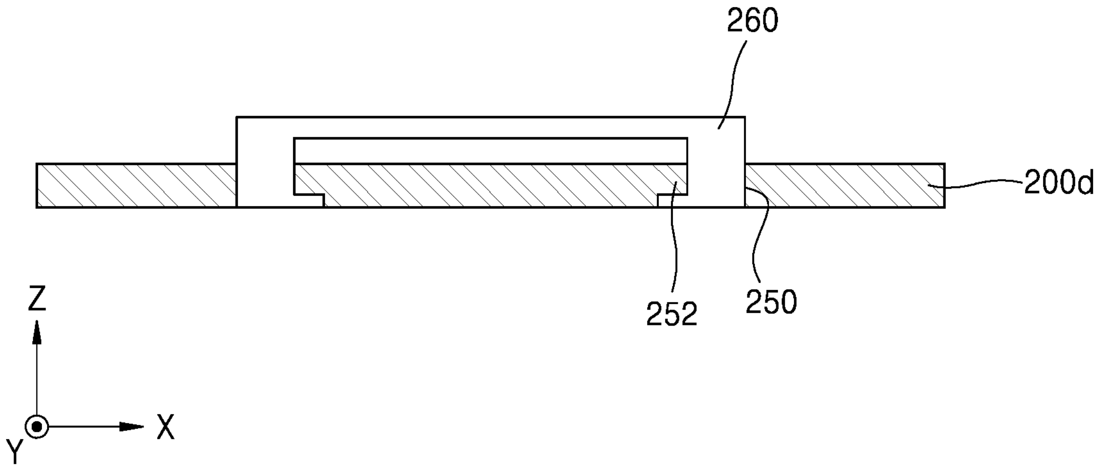
FIG. 5B is a side view of the holding plate including the rail and the cover, according to an embodiment.

FIG. 5A is a plan view of a portion of a sample holder including a holding plate, a rail and a cover, according to an embodiment, and FIG. 5B is a side view of the sample holder including the holding plate, the rail and the cover, according to an embodiment.

Referring to FIGS. 5A and 5B, the sample holder 10*d* may include the holding plate 200*d*, a rail 250, a cover 260, and a plurality of sample holes 300. The sample holes 300 of the holding plate 200*d* of FIGS. 5A and 5B may be the same or substantially the same as the sample holes 300 of FIGS. 1A to 1C, and thus, only the holding plate 200*d*, the rail 250 and the cover 260 will be described below.

The rail 250 may be disposed on the holding plate 200*d* along an edge of the holding plate 200*d*. The rail 250 may extend in the same direction as an extension direction of the holding plate 200*d*. For example, the lengthwise direction of the rail 250 may be the same as the lengthwise direction of the holding plate 200*d*. For example, the holding plate 200*d* and the rail 250 may extend in a first horizontal direction (an X direction). The rail 250 may be arranged apart from the plurality of sample holes 300 in a horizontal direction (an X direction and/or a Y direction). The rail 250 may include a step portion 252 which is adjacent to an upper surface of the rail 250 and protrudes in an inward direction thereof from a side surface of the rail 250.

The cover 260 may be movably mounted on the holding plate 200*d*. The cover 260 may be configured to move along the rail 250. The cover 260 may move along the rail 250 to cover at least one of the plurality of sample holes 300. A lower structure of the cover 260 may engage with the step portion 252, and the cover 260 may move along the rail 250, based on a slide scheme. A plan view area of the cover 260 may be greater than a plan view area of each of the sample holes 300. For example, the cover 260 may have a flat and horizontal upper surface, and an area of the horizontal flat upper surface of the cover 260 may be greater than the plan view area of each of the plurality of sample holes 300. For example, the plan view area of the upper surface of the cover 260 may be greater than a plan view of each of the sample holes 300 and/or a plan view area of multiple sample holes 300. For example, the cover 260 may cover and be configured to cover (e.g., vertically overlap) two or more sample holes 300 at the same time.

The rail 250 and/or the cover 260 described with reference to FIGS. 5A and 5B may be disposed in the sample holders 10, 10*a*, 10*b*, and 10*c* of FIGS. 1A to 4B respectively including two, three, and four holding plates 200, 200*a*, 200*b*, and 200*c*.

Figure 6:
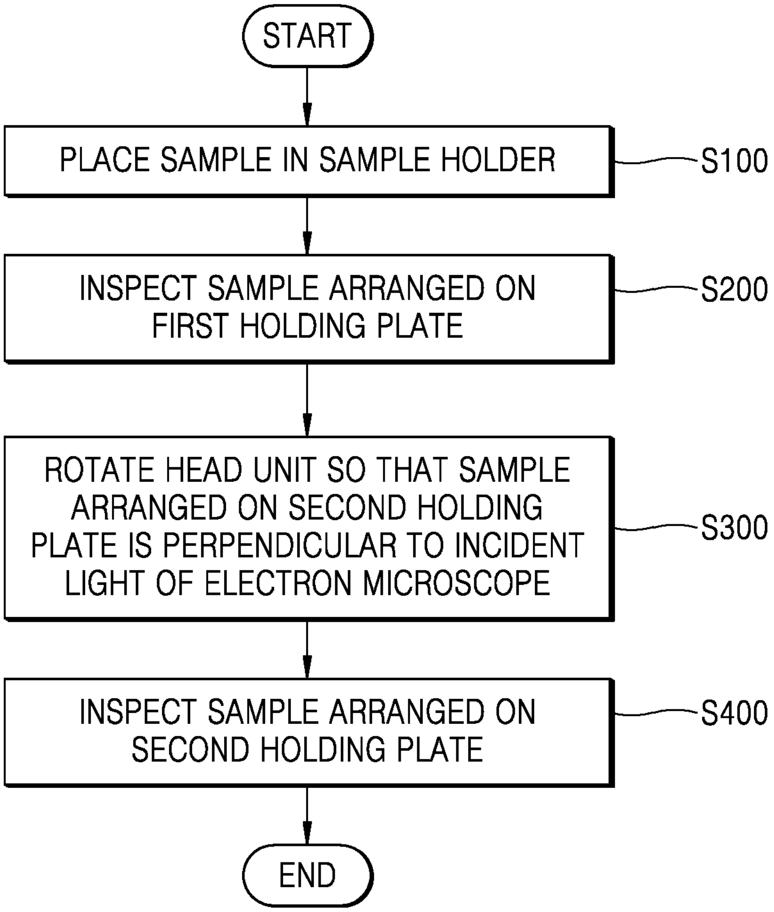
FIG. 6 is a flowchart illustrating a semiconductor device inspection method using a sample holder, according to an embodiment.

FIG. 6 is a flowchart illustrating a semiconductor device inspection method using a sample holder, according to an embodiment.

Referring to FIGS. 1A, 1B, 1C and 6, the sample SP may be disposed in the sample holder 10 in operation S100. The sample SP may be disposed in the sample hole 300 of the first holding plate 210 and the sample hole 300 of the second holding plate 220.

Subsequently, in operation S200, the sample SP disposed on the first holding plate 210 may be inspected by the electron microscope 400. The incident light IR of the electron microscope 400 may proceed vertically and perpendicularly to a main surface of the sample SP disposed on the first holding plate 210. For example, the incident direction of the incident light IR of the electron microscope 400 may be vertical and may be perpendicular to the main surface 210M of the first holding plate 210. At least a portion of the incident light IR radiated/emitted onto the sample SP may pass through the sample SP and may be input to and/or received by the electron microscope 400, and the electron microscope 400 may measure and/or analyze light input thereto. In another embodiment, at least a portion of the incident light IR radiated/emitted onto the sample SP may pass through the sample SP, and then, light reflected by a reflection plate (not shown) disposed at a vertical level which is lower than the sample hole 300 may be measured and/or analyzed by the electron microscope 400.

Subsequently, in operation S300, the head unit 100 may rotate so that the sample SP disposed on the second holding plate 220 is perpendicular to the incident light IR of the electron microscope 400. For example, the rotary unit 120 may rotate the head unit 100.

Subsequently, in operation S400, the sample SP disposed on the second holding plate 220 may be inspected by the electron microscope 400. A method of inspecting the sample SP disposed on the second holding plate 220 may be the same as or approximately similar to a method of inspecting the sample SP disposed on the first holding plate 210.

The inspection method illustrated in FIG. 6 and described above is a part of a method of manufacturing semiconductor devices. For example, the inspection may be performed to monitor semiconductor device manufacturing processes. For example, the inspection of the samples may be helpful to uncover/find conditions of the semiconductor device manufacturing processes and/or designs of semiconductor devices that need to be changed and/or improved. Therefore, according to an embodiment of the present disclosure, a method of manufacturing a semiconductor device may include the inspection method disclosed above, and may further include steps of fabricating samples by one or more semiconductor device manufacturing processes, steps of modifying the one or more semiconductor device manufacturing processes based on the inspection result of the samples, and steps of manufacturing a semiconductor device using the modified one or more semiconductor device manufacturing processes. As an example, the semiconductor devices may be semiconductor packages and/or semiconductor chips.

Hereinabove, exemplary embodiments have been described in the specification with reference to drawings illustrating corresponding embodiments. Embodiments have been described by using the terms described herein, but this has been merely used for describing the inventive concept and has not been used for limiting a meaning or limiting the scope of the inventive concept defined in the following claims. Therefore, it may be understood by those of ordinary skill in the art that various modifications and other equivalent embodiments may be implemented from the inventive concept. Accordingly, the spirit and scope of the inventive concept may be defined based on the spirit and scope of the following claims.

While the inventive concept has been particularly shown and described with reference to embodiments thereof, it will be understood that various changes in form and details may be made therein without departing from the spirit and scope of the following claims.

What is claimed is:

1. A sample holder comprising:
- a head;
- a first holding plate extending in a first direction from one surface of the head and including at least one first sample hole configured to accommodate at least one first sample and a first main surface configured such that the at least one first sample accommodated in the at least one first sample hole is exposed at the first main surface; and
- a second holding plate extending in the first direction from the one surface of the head and including at least one second sample hole configured to accommodate at least one second sample and a second main surface configured such that the at least one second sample accommodated in the at least one second sample hole is exposed at the second main surface,
- wherein a direction perpendicular to the first main surface of the first holding plate differs from a direction perpendicular to the second main surface of the second holding plate.

2. The sample holder of claim 1, wherein an angle between the first holding plate and the second holding plate is 90 degrees to 180 degrees.

3. The sample holder of claim 1, further comprising a rotary configured to rotate the head.

4. The sample holder of claim 3, wherein a rotational axis of the rotary is parallel to the first direction.

5. The sample holder of claim 1, further comprising:
- a rail extending in the first direction, on the first holding plate or the second holding plate; and
- a cover configured to move on and along the rail and cover the at least one first or second sample hole.

6. The sample holder of claim 1, wherein the first holding plate or the second holding plate comprises:
- a prop configured to support a lower surface of the at least one first or second sample hole; and
- a fastener configured to fix an edge of an upper surface of the at least one first or second sample hole.

7. The sample holder of claim 1, wherein the first holding plate and the second holding plate are provided as one body.

8. A sample holder comprising:
- a head; and
- a plurality of holding plates extending in a first direction from one surface of the head and each of the plurality of holding plates including at least one sample hole configured to accommodate at least one sample and a main surface configured such that the at least one sample accommodated in the at least one sample hole is exposed at the main surface,
- wherein directions perpendicular to respective main surfaces of at least two holding plates of the plurality of holding plates differ from each other, and
- at least one holding plate of the plurality of holding plates comprises:
- an internal space configured such that the at least one sample is arranged in the internal space, and such that at least a portion of a lower surface and at least a portion of an upper surface of the at least one sample are exposed to outside of the at least one holding plate;
- a prop configured to support a lower surface of the at least one sample; and a fastener configured to plug an edge of the upper surface of the at least one sample.

9. The sample holder of claim 8, wherein an angle between holding plates adjacent to each other along an edge of the head among the plurality of holding plates is 90 degrees to 180 degrees.

10. The sample holder of claim 8, wherein each of the plurality of holding plates is in contact with an adjacent holding plate of the plurality of holding plates.

11. The sample holder of claim 8, wherein at least two holding plates of the plurality of holding plates are apart from each other in a direction perpendicular to the first direction.

12. The sample holder of claim 8, wherein a distance in the first direction between adjacent sample holes formed in each of the plurality of holding plates is about 3 mm to about 10 mm.

13. The sample holder of claim 8, wherein sample holes formed in each of the plurality of holding plates are arranged to have the same distance.

14. The sample holder of claim 8, wherein the plurality of holding plates each has the same width as widths of the other holding plates in the first direction.

15. The sample holder of claim 8, wherein the first direction is perpendicular to a direction of incidence of incident light incident on the at least one sample.

16. A method of manufacturing a semiconductor device comprising:

fabricating samples by one or more semiconductor device manufacturing processes;

placing the samples on a first holding plate and on a second holding plate of a sample holder;

inspecting a first sample placed on the first holding plate;

rotating a head of the sample holder so that a top surface of a second sample placed on the second holding plate is perpendicular to an incident light of an electron microscope;

inspecting the second sample arranged on the second holding plate;

modifying the one or more semiconductor device manufacturing processes based on the inspection result of the first sample and the second sample; and manufacturing a semiconductor device using the modified one or more semiconductor device manufacturing processes, wherein the sample holder comprises:

the head;

the first holding plate extending in a first direction from one surface of the head and including at least one first sample hole accommodating the first sample and a first main surface at which the first sample placed in the at least one first sample hole is exposed; and the second holding plate extending in the first direction from the one surface of the head and including at least one second sample hole accommodating the second sample and a second main surface at which the second sample placed in the at least one second sample hole is exposed, and a direction perpendicular to the first main surface of the first holding plate differs from a direction perpendicular to the second main surface of the second holding plate.

17. The method of claim 16, wherein an angle between the first holding plate and the second holding plate is 90 degrees to 180 degrees.

18. The method of claim 16, wherein the sample holder comprises:

a rail disposed on the first holding plate and extending in the first direction; and a cover configured to move on and along the rail and cover the at least one first sample hole.

19. The method of claim 16, wherein the sample holder further comprises a rotary configured to rotate the head, and wherein a rotational axis of the rotary is parallel to the first direction.

20. The method of claim 16, wherein the first holding plate and the second holding plate are provided as one body.

* * * * *